(12) United States Patent
Ausschnitt et al.

(10) Patent No.: US 6,335,151 B1
(45) Date of Patent: Jan. 1, 2002

(54) MICRO-SURFACE FABRICATION PROCESS

(75) Inventors: Christopher P. Ausschnitt, Brookfield, CT (US); Nancy Greco, Lagrangeville; Ernest N. Levine, Poughkeepsie, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/335,609

(22) Filed: Jun. 18, 1999

(51) Int. Cl.⁷ .................................................. G03F 9/00
(52) U.S. Cl. ........................................... 430/322; 430/5
(58) Field of Search .............................. 430/5, 22, 30, 430/321, 322, 323, 324

(56) References Cited

U.S. PATENT DOCUMENTS

| | | | |
|---|---|---|---|
| 4,128,752 A | 12/1978 | Gravel | 219/121 |
| 4,944,838 A | 7/1990 | Koch et al. | 156/652 |
| 5,079,130 A | 1/1992 | Derkits, Jr. | 430/321 |
| 5,190,637 A | 3/1993 | Guckel | 205/118 |
| 5,230,990 A | 7/1993 | Iwasaki et al. | 430/321 |
| 5,730,924 A | 3/1998 | Katoh et al. | 264/488 |
| 5,900,340 A * | 5/1999 | Reich et al. | 430/22 |
| 6,091,486 A * | 7/2000 | Kirk | 356/124 |

* cited by examiner

*Primary Examiner*—Mark F. Huff
*Assistant Examiner*—Saleha R. Mohamedulla
(74) *Attorney, Agent, or Firm*—Ratner & Prestia; Tiffany L. Townsend

(57) ABSTRACT

A lithographic process for creation and replication of well-controlled surfaces of arbitrary profiles on a sub-micron scale. The surfaces are defined by a mathematical function using a binary mask, consisting partly or wholly of subresolution features, and a photoresist film of pre-specified absorption and thickness. The process comprises the steps of (a) creating a mask, (b) imaging the mask pattern on an absorbing photoresist film to a predetermined thickness, and (c) transferring the three dimensional surface to a substrate.

11 Claims, 8 Drawing Sheets

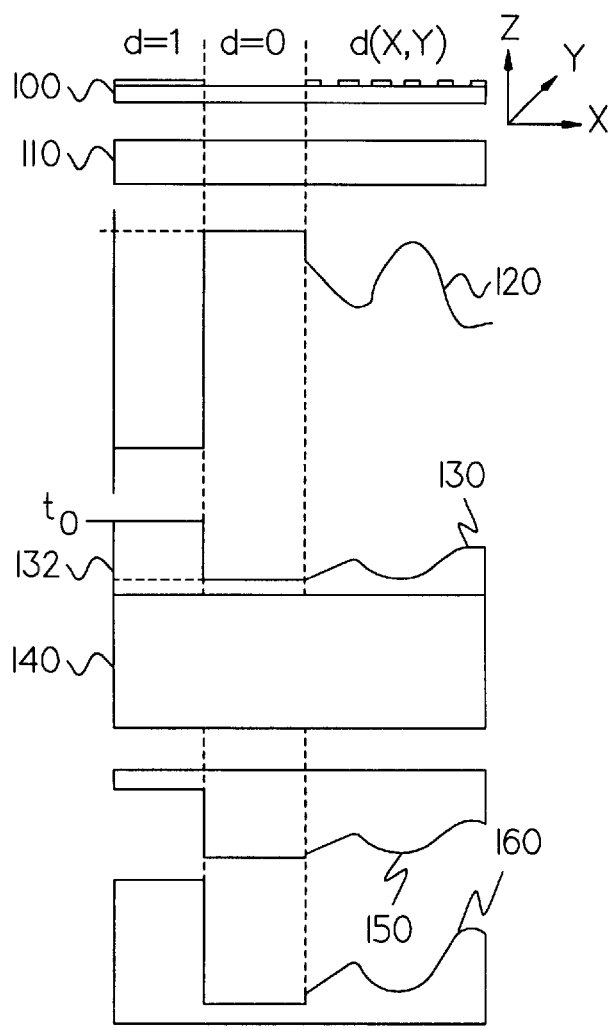
FIG. 1
(PRIOR ART)
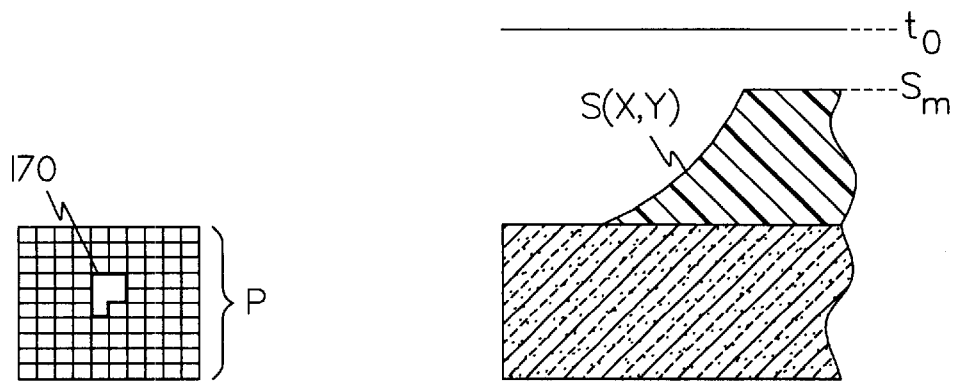
FIG. 2         FIG. 4

MICRO-SURFACE FABRICATION PROCESS

TECHNICAL FIELD

The present invention relates generally to lithography and, more particularly, to micro-surface fabrication.

BACKGROUND OF THE INVENTION

Many integrated optics, semiconductor, and micromachining applications require the creation of well-controlled, three-dimensional surfaces on a sub-micron scale. These applications include micro-optical system element (mirror, lens, waveguide, etc.) fabrication, particularly where dense arrays are required. Often the surface configuration is defined by a mathematical function to facilitate fabrication. There is a need for continuous control of the surface configuration to match a predefined mathematical function tailored to a specific application.

Formation of well-controlled surfaces on a sub-micron scale has many potential applications in both semiconductor manufacturing and micro-machining. A semiconductor example is the formation of tapered vias, in which the taper is useful in optimizing subsequent fill characteristics or relieving stress buildup at the substrate interface. A micro-machining example is the ability to manufacture optical components with arbitrary, yet well-controlled, angle and curvature.

Current methods of creating surfaces are limited by their ability to control the surface contours on a sub-micron scale and do not enable rapid replication of a given surface profile. These methods include various etching and polishing techniques. Standard lithography is one such process.

Standard lithography does not enable continuous control of surface configuration. For an example of lithography on discrete layers, see U.S. Pat. No. 4,944,838 to Koch. For an example of lithography and mold transfer, see U.S. Pat. No. 5,230,990 to Iwasaki. For an example of lithography and etch transfer with thermal processing, see U.S. Pat. No. 5,079,130 to Derkits. For an example of lithography in absorbing resist, see J. P. Kirk and M. S. Hibbs, "DUV diagnostics using continuous tone photoresist," 1463 SPIE at 575 (1991).

X-ray lithography and electroplating also do not enable continuous control of surface configuration. For example, see U.S. Pat. No. 5,190,637 to Guckel.

Ablation and ion milling are relatively slow processes. It is difficult to control replication in such processes, and they have relatively poor resolution. Therefore, ablation and ion milling are not compatible with standard lithography techniques. For an example of X-ray ablation of absorbing material, see U.S. Pat. No. 5,730,924 to Katoh. For an example of laser ablation using mask to produce multiple beams, see U.S. Pat. No. 4,128,752 to Gravel.

The deficiencies of the conventional methods for creating surfaces show that a need still exists for formation of well controlled surfaces. To overcome the shortcomings of the conventional methods, a new lithography method is provided. An object of the present invention is to control creation of a microscopic three dimensional surface.

SUMMARY OF THE INVENTION

To achieve these and other objects, and in view of its purposes, the present invention provides a lithographic process to fabricate a microscopic, three-dimensional surface. The surface is defined by a mathematical function using a binary mask, consisting partly or wholly of subresolution features, and a photoresist film of pre-specified absorption and thickness. The process comprises the steps of (a) creating a mask, (b) imaging the mask pattern on an absorbing photoresist film to a predetermined thickness, and (c) transferring the three dimensional surface to a substrate.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 illustrates an example of a conventional lithography practice;

FIG. 2 illustrates an example of a mask pixellation;

FIG. 4 is a detailed view of resist topography in which a micro-surface, $S(x,y)$, has been defined;

DETAILED DESCRIPTION OF THE INVENTION

I. Overview

Figure 3:
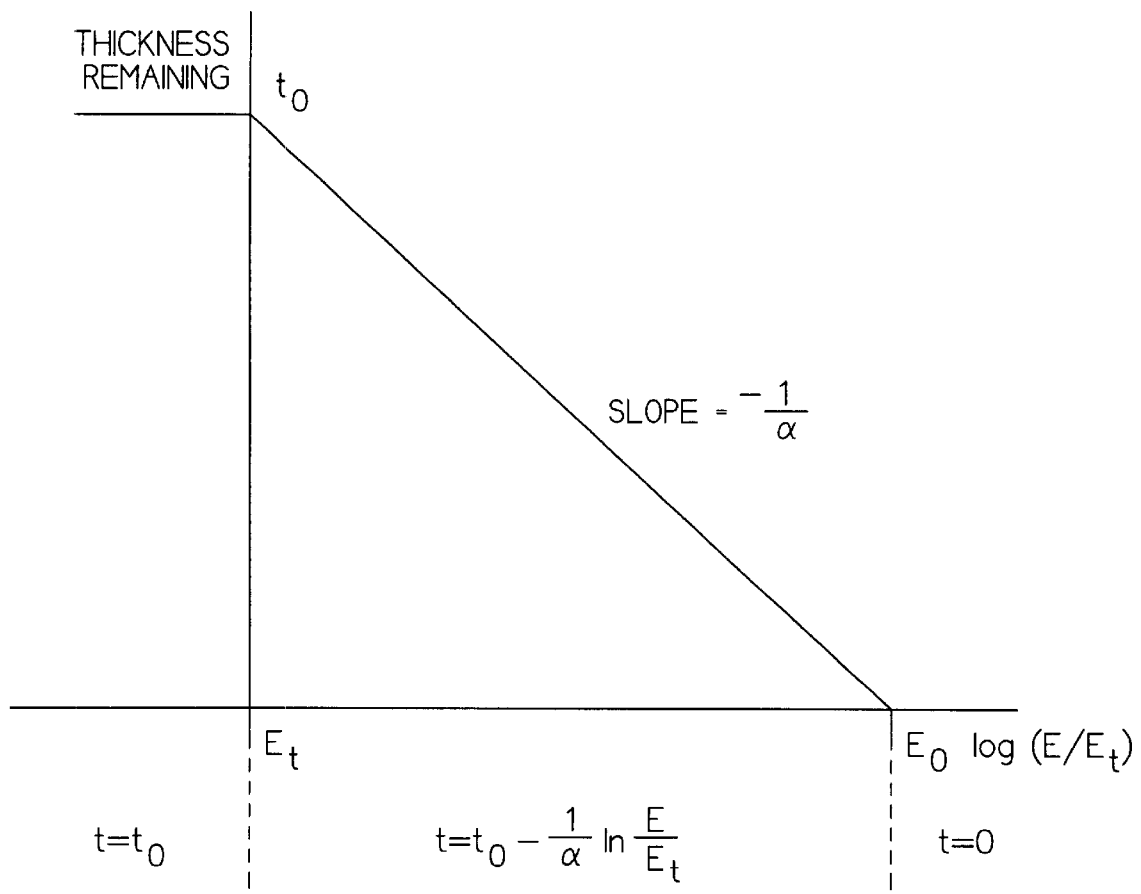
FIG. 3 illustrates an example of an absorbing resist characteristic curve.

The present invention enables the creation and replication of well-controlled surfaces of arbitrary profile on a sub-micron scale using a lithographic process. The invention uses a mask layout consisting of opaque or partially transmitting patterns of varying density. In some cases, none of the patterns can be resolved by a lithographic exposure tool. In other cases, some of the patterns can be resolved and others cannot be resolved.

The key attribute of the unresolved patterns is that they act as a variable attenuator of the transmitted light on a scale corresponding to their pitch. Minimum pitch capability on masks is in the 0.1–0.5 μm range, depending on mask writing capability. For 5× exposure tools, this pitch capability enables attenuation control on the scale of 0.02–0.1 μm. This dimension represents the minimum pixel size for relative amplitude change of the aerial image. In addition, the spatial frequency content of the image is limited by the modulation transfer function of the exposure lens which will cutoff above the 0.1 μm value, preventing resolution of the individual elements of the subresolution patterns.

For example, a mask appropriate for the formation of tapered side walls in a semiconductor process would have resolvable pattern edges feathered by subresolution features to continuously vary the mask transmission in the neighborhood of the resolvable pattern edge. The edge feathering is matched to the imaging characteristics of an exposure tool. Such matching assures that the image intensity varies continuously with distance from the edge corresponding to the desired side wall profile.

The invention also uses an absorbing resist, such that the contours of the developed image follow the contours of the image intensity. In addition, the invention allows transfer of the developed image. In semiconductor processing, transfer would be accomplished using an anisotropic etch. The relative etch rate of the substrate and resist will determine the vertical scale of the surface. An anisotropic etch can also be applied in micromachining or microforming applications. Other applications can also include an anisotropic etch. The resist itself can be used if it has the right mechanical properties. Another approach is to use the resist image as a mold or stamp to produce surface replicas in a conforming medium.

II. Detailed Description

Referring now to the drawing, wherein like reference numerals refer to like elements throughout, FIG. 1 shows a conventional fabrication system. The conventional system consists of a mask 100, an imaging system 110, an aerial image 120, a resist image 130, a substrate 140, a mold transfer 150, and an etch transfer 160. The resist image 130 corresponds to a photoresist 132 coated on the substrate 140 and having an undeveloped thickness, $t_0$ (microns), and an absorption coefficient, α (inverse microns), at the imaging wavelength, λ (nanometers). The thickness of photoresist 132 can be adjusted by conventional coating techniques. The absorption can be either innate to the photoresist material, or adjusted by the use of conventional additives, such as absorbing dyes. For the sake of simplicity, it is assumed non-bleaching absorption, which is an excellent approximation for most chemically amplified resists. Furthermore, it is also assumed that there is no reflection from the resist/substrate interface, which can be ensured by the use of an antireflection (highly absorbing) layer. These assumptions simplify the analysis, but are not fundamental to the invention. The function d(x,y) represents the density of subresolution patterns on the mask 100 and varies between d=0 and d=1.

The present invention is a process to design the mask layout and photoresist properties for the fabrication of pre-specified microscopic surfaces, as would be required in the manufacture of microscopic optical elements and optical element arrays. The invention takes advantage of the fact that the minimum addressable area of the mask 100 can be significantly smaller than the minimum resolution of the imaging system 110. The patterned area of the mask 100 divided into pixels "p" (square formed by the minimum addressable pattern size of the mask-making process) and superpixels "P" (square formed by the maximum unresolvable pitch of the lithographic process), as shown in FIG. 2.

The present invention requires that P=N×p, where the integer "N" is much larger than 1. A binary mask allows each pixel, p, to have one of two possible transmission values, usually either opaque or fully transmitting. The local pattern density, d, is given by the ratio of the opaque area 170, expressed as a multiple of pixels, np, to the area of the superpixel, as defined by d=np/P. By changing n, this density can be varied at each superpixel location on the mask 100, creating the density function, d(x,y).

Superpixels are not resolvable provided that P<Rλ/(NA (1+σ)), where R is the reduction ratio of, λ is the wavelength of, NA is the numerical aperture of, and σ is the coherence of the imaging system 110. In this case, the image intensity at the wafer plane can be described by a continuous function proportional to the mask transmission, T(x,y)=1−d²(x,y). (In FIG. 2, P<λ/(2NA)). A readily achievable example of a lithography mask and exposure tool that meets the above condition is:

λ=250 nm
NA<0.5
σ=1
p=100 nm
P=1,000 nm
R=4.

The mask 100, consisting of unresolvable patterns whose density may vary over the mask surface, is imaged on an absorbing photoresist film of thickness, $t_0$. The density of the subresolution patterns on the mask 100 is described by the function d(x,y) over the surface of the mask 100. The function d(x,y) can approximate any continuously varying function.

The thickness of the developed photoresist 132 is defined by the function t(x,y), corresponding to the resist image 130. The threshold energy of the photoresist 132 is $E_t$. The maximum energy incident on the photoresist 132 is $E_m$ and the spatial distribution of incident energy is defined by the function E(x,y). In regions covered by subresolution patterns, the image energy (dose) is defined by $E(x,y)=E_m[1-d^2(x,y)]$, corresponding to the aerial image 120, where $E_m$ is the dose in a clear region of the mask 100 and d is a value between 0 (clear) and 1 (opaque).

FIG. 3 is an example of an absorbing resist characteristic curve in which the developed thickness of the photoresist film is given by:

$$t_0, \quad E(x,y) < E_t$$
$$t(x,y) = t_0 - \alpha^{-1} \ln[E(x,y)/E_t], \quad E_t < E(x,y) < E_t \exp(\alpha t_0) \quad (1)$$
$$0, \quad E_t \exp(\alpha t_0) < E(x,y)$$

where $E_t$ is the threshold energy and α is the absorption coefficient of the resist material. Thus, the developed surface of the resist has a functional form that is directly related to the density of subresolution patterns on the mask 100. The resist topography can be used as is, or transferred to a substrate by conventional anisotropic etch processes (e.g., reactive ion etching, ion milling, and the like), mold processes, or both.

The developed photoresist surface height is represented by the function S(x,y). To produce any desired surface height, S(x,y), the density of subresolution patterns on the mask 100 are designed such that $$d^2(x,y) = 1 - \exp[-\alpha S(x,y)] \quad (2)$$

The resulting developed resist topography is then defined by $t(x,y)=t_0-\alpha^{-1}\ln(E_m/E_t)+S(x,y)$, as shown in FIG. 4. The degree to which the mask density approximates the function of Equation (2) depends on the relationship of the superpixel size, P, to the spatial frequency content of $S(x,y)$. In general, $1/P$ must be equal to or greater than the highest spatial frequency of $S(x,y)$ that is desired to be created.

In addition, as discussed below, the product, $c=\alpha t_0$ of the absorption, $\alpha$, and the photoresist thickness, $t_0$, must be in a regime that enables generation of the desired surface. Under the constraint that the surface minimum, S=0, be at the photoresist substrate interface, t=0, then the required exposure dose relative to the photoresist threshold $$E_m/E_t=e^c \quad (3)$$

is obtained by substitution in Equation (1). The added constraint that the maximum surface height, $S_m$, equal the resist thickness, $t_0$, determines the maximum mask density $$d_m=(1-e^{-c})^{1/2} \quad (4)$$

from Equation (2).

Figure 5:
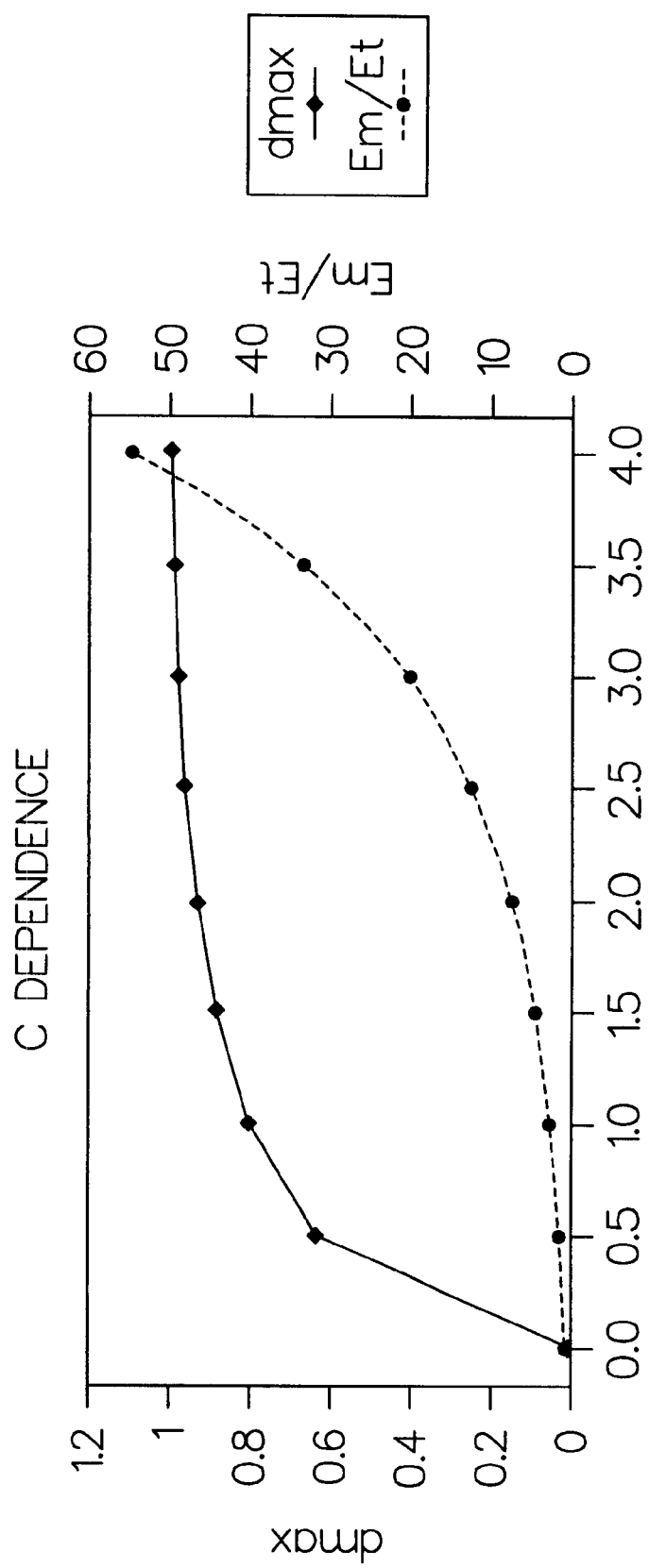
FIG. 5 illustrates the dependence of maximum dose and density on resist film characteristic, $c=\alpha t_0$.

The dependence of $E_m/E_t$ and $d_m$ on c is shown in FIG. 5. In the implementation of the invention it is desirable to operate where the most of the dynamic range of mask density is utilized, $d_m>0.8$, which requires c>1.0. Also, it is preferable to operate in a reasonable dose regime $E_m/E_t$, which requires c<4.0. If, for example, c=2.5, then surfaces in a 5 µm thick resist film would be created having an absorption of 0.5 µm$^{-1}$.

Possible two-dimensional surfaces can be described by mathematical functions normalized to the maximum surface height, $S_m$. Examples include the following:

linear: $s(x)=x$ parabolic: $s(x)=x^2$ spherical: $s(x)=(1-(1-x^2)^{1/2})$ square-root: $s(x)=x^{1/2}$ where $x=X/X_m$, $s(x)=S(x)/S_m$.

Figure 6:
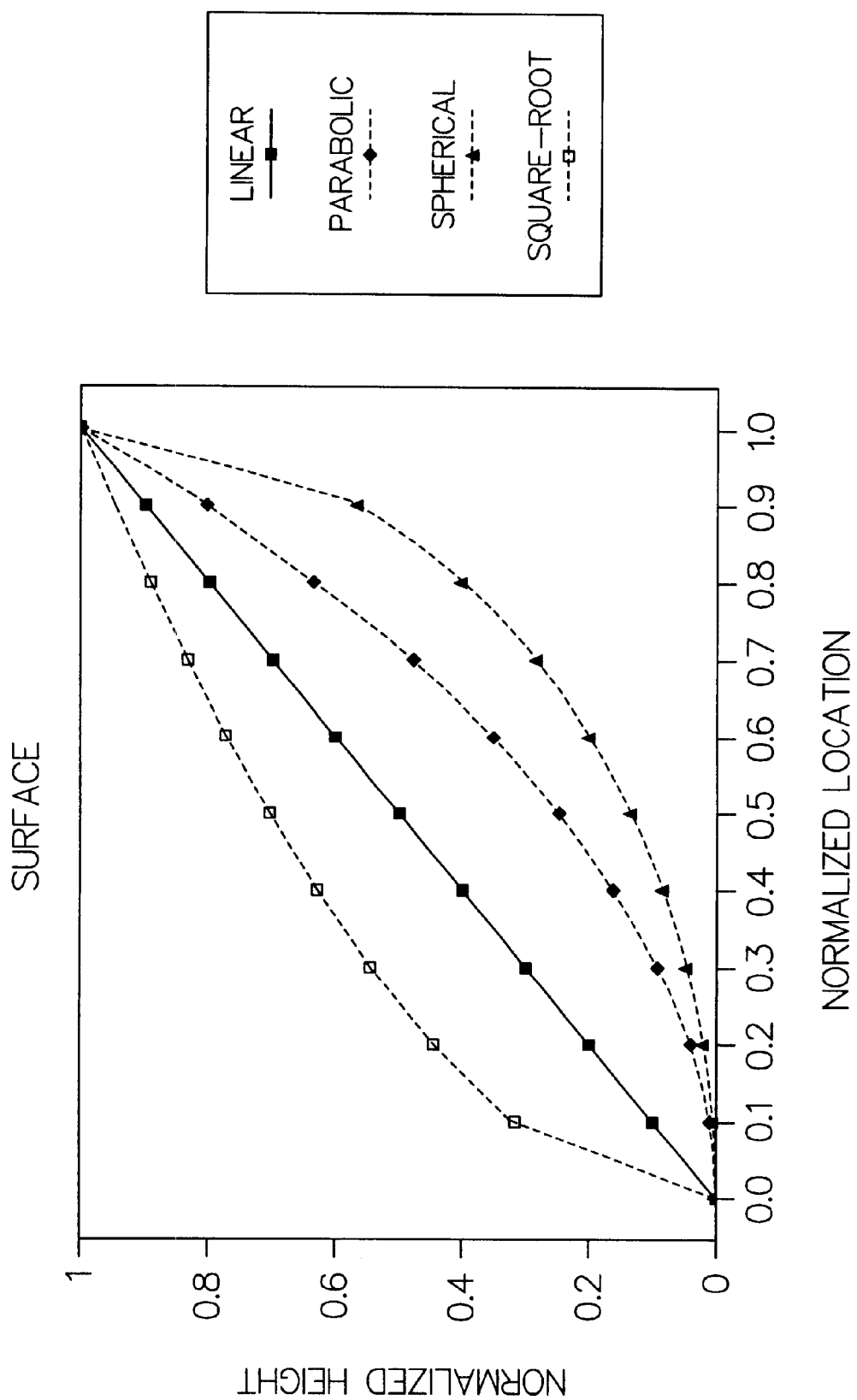
FIG. 6 illustrates the cross sections of exemplary two-dimensional surfaces defined by different mathematical functions (linear, parabloic, spherical and square-root)
Figure 7:
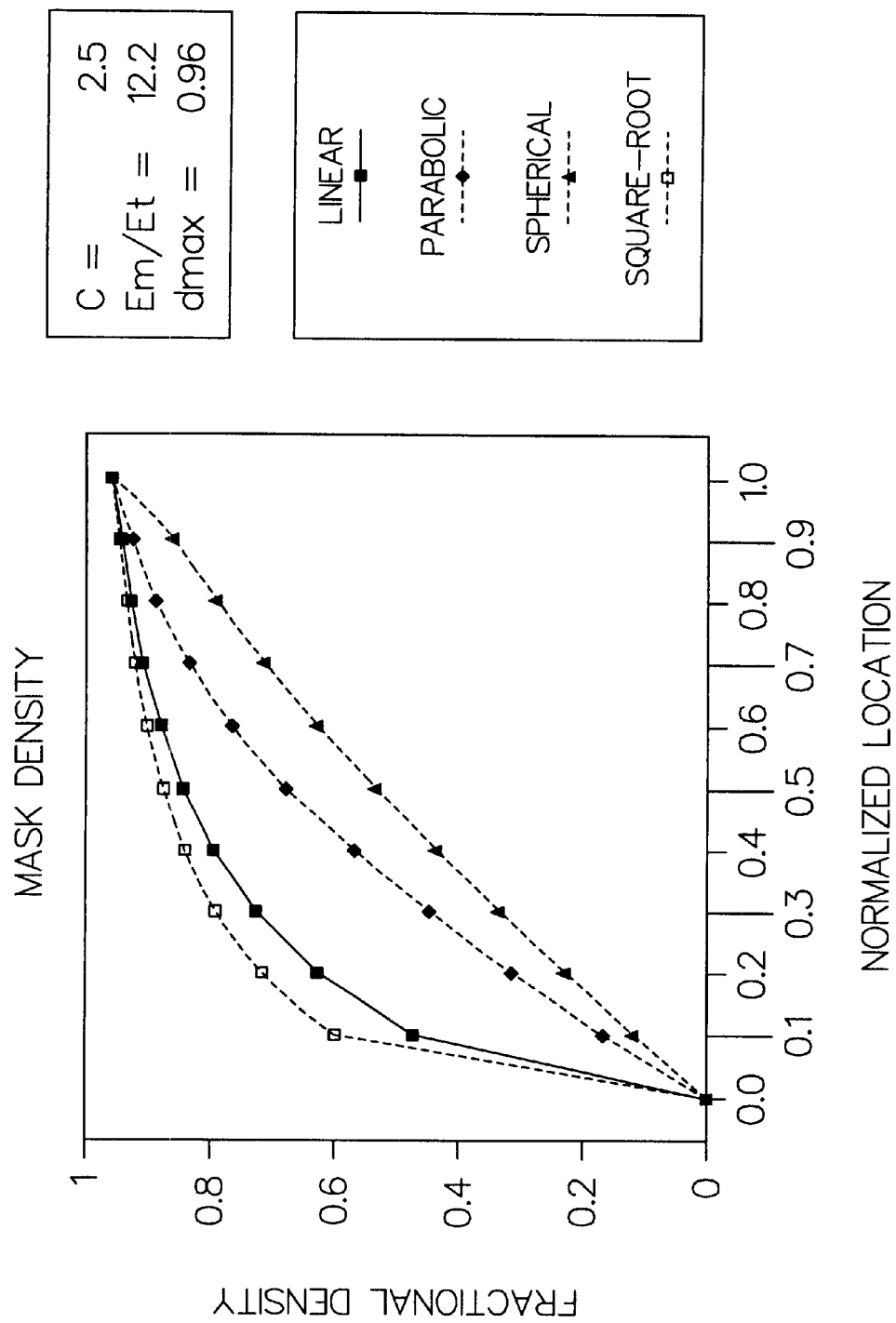
FIG. 7 illustrates an example of a mask pattern density required to produce the surfaces shown in FIG. 6 for $c=2.5$.
Figure 8A:
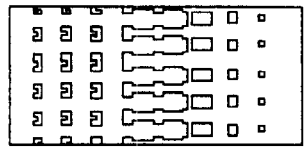
FIGS. 8A, 8B, 8C and 8D illustrate examples of binary mask patterns used to produce intensity variation in one dimension.
Figure 8C:
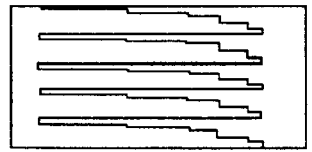
Figure 8B:
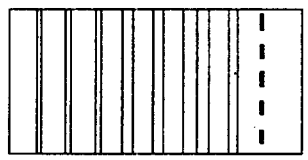
Figure 8D:
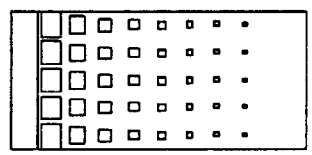

Cross-sections of the exemplary two-dimensional surfaces are shown in FIG. 6. The mask density variation to produce these surfaces under the condition c=2.5 is shown in FIG. 7. The required mask density variation to produce $S(x,y)$ in a 5 µm thick resist film can be achieved under the conditions where P=1,000 nm and p=100 nm. The exposure dose must be low enough to enable exposure in a reasonable time, and the variation in mask pattern density required must be achievable by reasonable patterning technology. The exposure dose required is 12.2 times the resist threshold dose, which would correspond to exposure times on the order of several seconds for typical lithographic tools and resists. The mask density varies by increments >1% per 200 nm change in distance (x position). A 1% change in density corresponds to a 100 nm change in linear dimension on the mask 100, which is well within the dimensional control capability of current mask-making technology. It is notable that the spherical surface requires a nearly linear variation in mask density which is most easily achieved.

Figure 9:
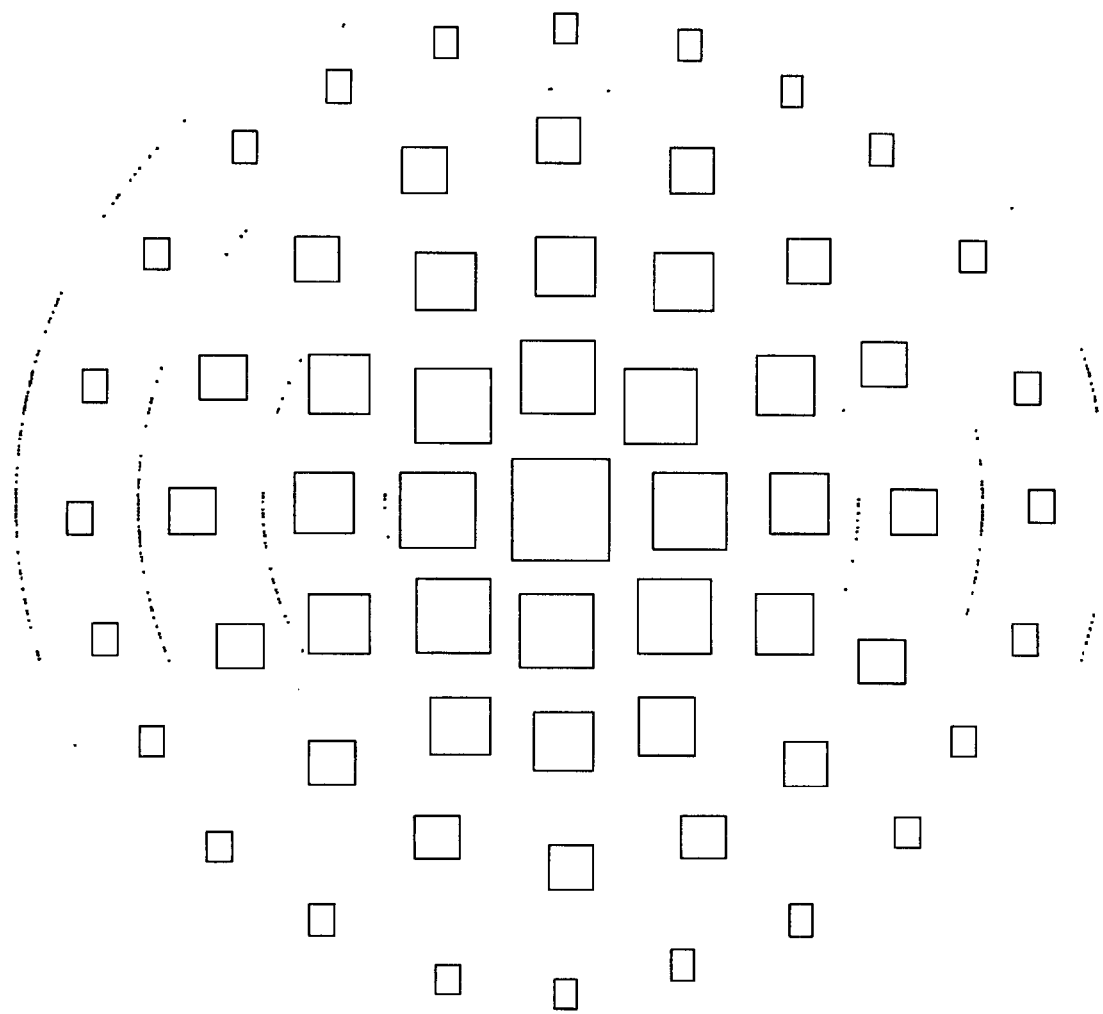
FIG. 9 illustrates an example of a binary mask pattern used to produce intensity variation in two dimensions.

Both two-dimensional and three-dimensional surfaces described by mathematical functions can be formed from appropriate mask layouts. Exemplary patterns for two-dimensional surfaces are shown in FIGS. 8A, 8B, 8C, and 8D. An exemplary pattern for a three-dimensional surface is shown in FIG. 9.

In the case where etch pattern transfer is used, the final etched surface is related to the resist surface by the relative etch selectivity, K, of the resist and substrate materials. In this case, an initial mask density $d^2(x,y)=1-\exp[-\alpha S(x,y)/K]$ is used.

EXAMPLES

The present invention can be applied to the fabrication of a wide variety of micro-optical devices and systems. The following examples are included to more clearly demonstrate the overall nature of the invention. These examples are exemplary, not restrictive, of the invention.

Figure 10:
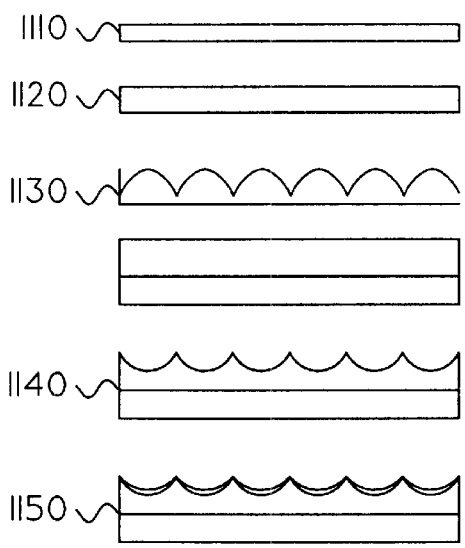
FIG. 10 illustrates an example of a micro-mirror array fabrication process accomplished by imaging periodic mask transmission variation.
Figure 11:
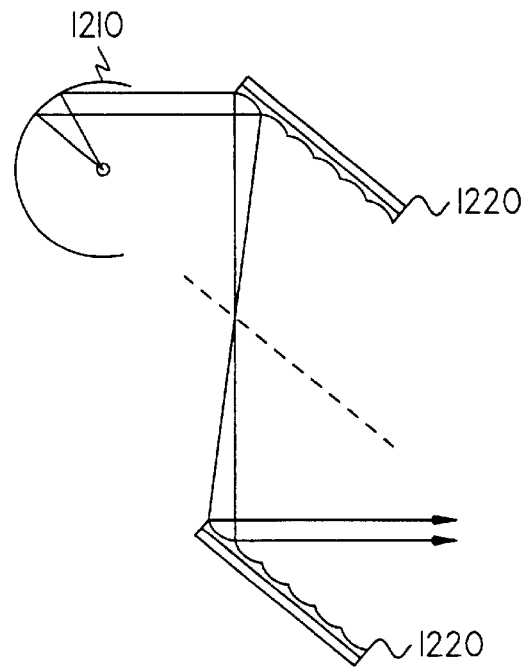
FIG. 11 illustrates an example of a collimating illumination system using micro-mirror arrays.

One example of the fabrication process for a micro-mirror array device is shown in FIG. 10. The accompanying micro-mirror collimation system is shown in FIG. 11. The micro-mirror array fabrication consists of a mask 1110, an imaging system 1120, an aerial image 1130, a developed mirror array 1140, and a reflective coating 1150. This embodiment, as shown in FIG. 11, consists of an optical illumination/imaging system 1210, coupling to optical fiber arrays 1220, or micro light concentrators such as would be required for detector arrays. See U.S. Pat. No. 5,352,886 to Kane for a description of micro non-imaging light concentrators for light sensors with a lenslet array.

Figure 12:
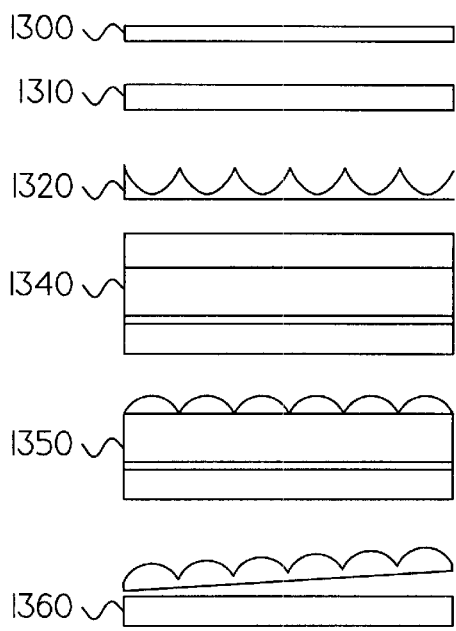
FIG. 12 illustrates an example of a micro-lens array fabrication process accomplished by sequential imaging of periodic mask transmission variation.
Figure 13:
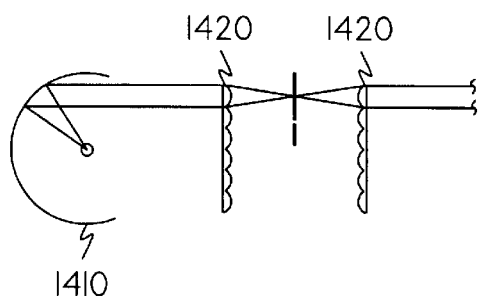
FIG. 13 illustrates an example of a collimating illumination system using micro-lens arrays.

A second example is the fabrication process for a micro-lens array (or "fly's eye" lens) as shown in FIG. 12. The accompanying micro-lens collimation system is shown in FIG. 13. The micro-lens array fabrication consists of a mask 1300, an imaging system 1310, an aerial image 1320, a film stack 1340, a developed/etched image 1350, and a substrate removal 1360. This embodiment, as shown in FIG. 13, is comprised of optical illumination systems 1410 such as those used in advanced lithography tools, coupling to optical fiber arrays 1420.

In the case of the optical elements cited a particular advantage of the invention is the ease with which aspherical elements can be fabricated.

Figure 14:
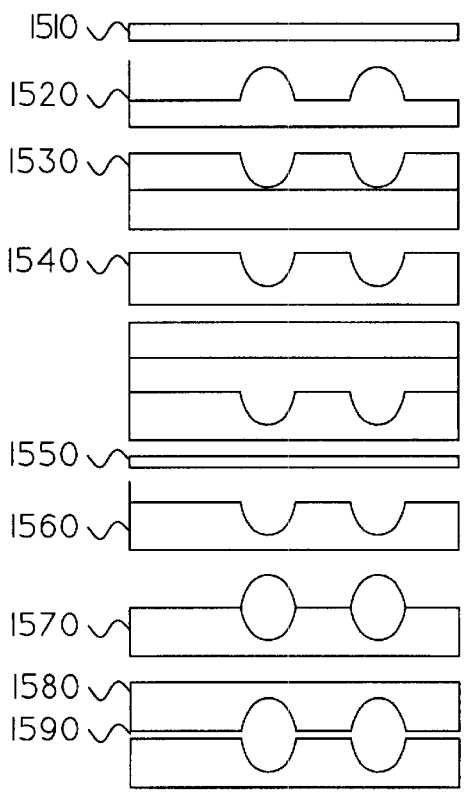
FIG. 14 illustrates an example of an embedded optical fiber fabrication process accomplished by sequential imaging of periodic mask transmission variation.
Figure 15:
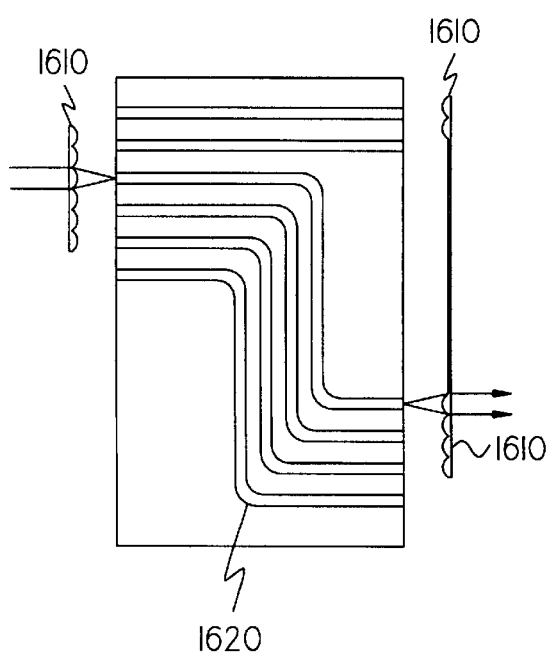
FIG. 15 illustrates an example of a micro-optical interconnect system using embedded optical fiber arrays and micro-lens arrays.

A third example is the fully integrated fabrication process for an embedded optical fiber array as shown in FIG. 14. The accompanying micro-optical interconnect system is shown in FIG. 15. The embedded optical fiber array fabrication consists of a first mask 1500, an aerial image 1520, a first developed and etched image 1530, a first deposited cladding 1540, a second mask 1550, a second developed and etched image 1560, a deposited cover 1570, and a second deposited cladding 1580. This embodiment, as shown in FIG. 15, is comprised of micro-lens arrays 1610 and embedded fiber arrays 1620.

Although illustrated and described with referral to certain specific embodiments, the present invention is nevertheless not intended to be limited to the details shown. Rather, various modifications may be made in the details of the scope and range of equivalents of the claims and without departing from the spirit of the invention.

What is claimed:

1. A lithographic process for fabricating a microscopic, three dimensional surface, comprised of the steps of:

a) creating a mask, consisting partly or wholly of sub-resolution patterns, by determining pixels p, wherein p is the square formed by the minimum addressable pattern size of the mask-creating process, determining superpixels P, wherein P is the square formed by the maximum unresolved pitch of the lithographic process, determining the local pattern density d defined by d=np/P where n is an integer greater than 1, and determining the density of the subresolution patterns defined by $d^2(x,y)=1-\exp[-\alpha S(x,y)]$ where $\alpha$ is the absorption coefficient of a resist material and $S(x,y)$ is the desired surface;

b) imaging the mask pattern on an absorbing photoresist film of a predetermined absorption and a predetermined thickness $t_0$, the thickness of the photoresist film is defined by $$t_0, E(x,y) < E_t$$
$$t(x,y) = t_0 - \alpha^{-1} \ln[E(x,y)/E_t], E_t < E(x,y) < E_t \exp(\alpha t_0)$$
$$0, E_t \exp(\alpha t_0) < E(x,y)$$

where $E(x,y)$ is the image energy and $E_t$ is the threshold energy; and c) transferring the three-dimensional surface to a substrate wherein the surface transferred is related to the substrate surface by a relative etch selectivity, K, and wherein the initial mask density is defined by $d^2(x,y) = 1 - \exp[-\alpha S(x,y)/K]$.

2. The lithographic process according to claim 1, wherein the three-dimensional surface is transferred to the substrate by a conventional anisotropic etch process.

3. The lithographic process according to claim 1, wherein the three-dimensional surface is transferred to the substrate by a conventional mold process.

4. The lithographic process according to claim 1, wherein the process is used to fabricate a micro-mirror array device adapted for use in a micro-mirror collimation system.

5. The lithographic process according to claim 1, wherein the process is used to fabricate a micro-lens array device adapted for use in a micro-lens collimation system.

6. The lithographic process according to claim 1, wherein the process is used to fabricate an embedded optical fiber array device adapted for use in a micro-optical interconnect system.

7. A lithographic process for fabricating a microscopic, three dimensional surface, comprised of the steps:
  creating a mask consisting partly or wholly of subresolution patterns;
  determining pixels p, wherein p is the square formed by the minimum addressable pattern size of the mask-creating process;
  determining superpixels P, wherein P is the square formed by the maximum unresolved pitch of the lithographic process;
  determining the local pattern density d defined by $d=np/P$ where n is an integer greater than 1;
  determining the density of the subresolution patterns defined by a mathematical function that relates the local pattern density d to the properties of a photoresist film and a desired surface;
  imaging the mask pattern on an absorbing photoresist film of a predetermined absorption and thickness; and
  transferring the three-dimensional surface to a substrate, wherein the mathematical function is defined by $$d^2(x,y) = 1 - \exp[-\alpha S(x,y)]$$

where $\alpha$ is the absorption coefficient of the photoresist material and $S(x,y)$ is the desired surface.

8. A lithographic process for fabricating a microscopic, three dimensional surface, comprised of the steps:
  creating a mask consisting partly or wholly of subresolution patterns;
  determining pixels p, wherein p is the square formed by the minimum addressable pattern size of the mask-creating process;
  determining superpixels P, wherein P is the square formed by the maximum unresolved pitch of the lithographic process;
  determining the local pattern density d defined by $d=np/P$ where n is an integer greater than 1;
  determining the density of the subresolution patterns defined by a mathematical function that relates the local pattern density d to the properties of a photoresist film and a desired surface;
  imaging the mask pattern on an absorbing photoresist film of a predetermined absorption and thickness; and
  transferring the three-dimensional surface to a substrate, wherein the thickness of the photoresist film is defined by $$t_0, E(x,y) < E_t$$
$$t(x,y) = t_0 - \alpha^{-1} \ln[E(x,y)/E_t], E_t < E(x,y) < E_t \exp(\alpha t_0)$$
$$0, E_t \exp(\alpha t_0) < E(x,y)$$

where $E(x,y)$ is the image energy and $E_t$ is the threshold energy, and wherein $\alpha$ is the absorption coefficient of the photoresist film.

9. A lithographic process for fabricating a microscopic, three dimensional surface, comprised of the steps:
  creating a mask consisting partly or wholly of subresolution patterns;
  determining pixels p, wherein p is the square formed by the minimum addressable pattern size of the mask-creating process;
  determining superpixels P, wherein P is the square formed by the maximum unresolved pitch of the lithographic process;
  determining the local pattern density d defined by $d=np/P$ where n is an integer greater than 1;
  determining the density of the subresolution patterns defined by a mathematical function that relates the local pattern density d to the properties of a photoresist film and a desired surface;
  imaging the mask pattern on an absorbing photoresist film of a predetermined absorption and thickness; and
  transferring the three-dimensional surface to a substrate, wherein the mathematical function is defined by $$d^2(x,y) = 1 - \exp[-\alpha S(x,y)/K]$$

where K is the relative etch selectivity, wherein $\alpha$ is the absorption coefficient of the photoresist film, and $S(x,y)/K$ is the desired surface.

10. A lithographic process for fabricating a microscopic, three dimensional surface, comprised of the steps:
  creating a mask consisting partly or wholly of subresolution patterns;
  determining pixels p, wherein p is the square formed by the minimum addressable pattern size of the mask-creating process;
  determining superpixels P, wherein P is the square formed by the maximum unresolved pitch of the lithographic process;
  determining the local pattern density d defined by $d=np/P$ where n is an integer greater than 1;
  determining the density of the subresolution patterns defined by a mathematical function that relates the local pattern density d to the properties of a photoresist film and a desired surface;
  imaging the mask pattern on an absorbing photoresist film of a predetermined absorption and thickness; and
  transferring the three-dimensional surface to a substrate, wherein the thickness is defined by $t_0, E(x,y) < E_t$ $t(x,y) = t_0 - \alpha^{-1} \ln[E(x,y)/E_t], E_t < E(x,y) < E_t \exp(\alpha t_0)$ $0, E_t \exp(\alpha t_0) < E(x,y)$ where E (x,y) is the image energy and $E_t$ is the threshold energy and wherein α is the absorption coefficient of the photoresist film, and the thickness of the photoresist film is defined by a mathematical function that relates the photoresist thickness to the exposure dose on the photoresist film properties of the photoresist film.

11. A lithographic process for fabricating a microscopic, three dimensional surface, comprised of the steps:

creating a mask consisting partly or wholly of subresolution patterns;

determining pixels p, wherein p is the square formed by the minimum addressable pattern size of the mask-creating process;

determining superpixels P, wherein P is the square formed by the maximum unresolved pitch of the lithographic process;

determining the local pattern density d defined by d=np/P where n is an integer greater than 1;

determining the density of the subresolution patterns defined by a mathematical function that relates the local pattern density d to the properties of a photoresist film and a desired surface;

imaging the mask pattern on an absorbing photoresist film of a predetermined absorption and thickness; and transferring the three-dimensional surface to a substrate, wherein the mathematical function is defined by $d^2(x,y) = 1 - \exp[-\alpha S(x,y)/K]$ where K is the relative etch selectivity, wherein α is the absorption coefficient of the photoresist film, and S(x,y)/K is the desired surface, the three-dimensional surface is transferred to the substrate by an anisotropic etch process, and the three-dimensional surface transferred is related to the substrate surface by a relative etch selectivity, and the initial mask density is defined by a mathematical function that relates the initial mask density to the properties of the photoresist film, to the properties of the anisotropic etch and to the desired surface.

* * * * *